(12) United States Patent
Saito et al.

(10) Patent No.: US 10,424,899 B2
(45) Date of Patent: Sep. 24, 2019

(54) SURFACE EMITTING QUANTUM CASCADE LASER

(71) Applicant: KABUSHIKI KAISHA TOSHIBA, Minato-ku (JP)

(72) Inventors: Shinji Saito, Yokohama (JP); Tsutomu Kakuno, Fujisawa (JP); Rei Hashimoto, Edogawa (JP); Kei Kaneko, Yokohama (JP); Yasunobu Kai, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/120,808

(22) Filed: Sep. 4, 2018

(65) Prior Publication Data

US 2019/0074663 A1    Mar. 7, 2019

(30) Foreign Application Priority Data

Sep. 5, 2017    (JP) .................................. 2017-170309

(51) Int. Cl.
*H01S 5/34*    (2006.01)
*H01S 5/10*    (2006.01)
(Continued)

(52) U.S. Cl.
CPC ............ *H01S 5/3402* (2013.01); *H01S 5/028* (2013.01); *H01S 5/0425* (2013.01); *H01S 5/105* (2013.01);
(Continued)

(58) Field of Classification Search
CPC .. H01S 2302/02; H01S 5/18386; H01S 5/187; H01S 5/305; H01S 5/343
(Continued)

(56) References Cited

U.S. PATENT DOCUMENTS 6,638,773 B1 * 10/2003 Hwang ................. H01S 5/1082
                                                         438/2
6,826,223 B1 * 11/2004 Meyer ...................... H01S 5/18
                                                         372/102
(Continued)

FOREIGN PATENT DOCUMENTS

JP    2003-273456    9/2003
JP    2009-231773    10/2009
(Continued)

OTHER PUBLICATIONS

Gangyi Xu, et al., "Surface-emitting quantum cascade lasers with metallic photonic-crystal resonators," Applied Physics Letters 94, 2009, 4 Pages.

*Primary Examiner* — Tuan N Nguyen
(74) *Attorney, Agent, or Firm* — Oblon, McClelland, Maier & Neustadt, L.L.P.

(57) ABSTRACT

A surface emitting quantum cascade laser includes an active layer and a first semiconductor layer. The active layer includes a plurality of quantum well layers and is capable of emitting laser light by intersubband transition. The first surface includes an internal region and an outer peripheral region. Grating pitch of the first pits is m times grating pitch of the second pits. The outer peripheral region surrounds the internal region. A first planar shape of an opening end of the first pit is asymmetric with respect to a line passing through barycenter of the first planar shape and is parallel to at least one side of the first two-dimensional grating. A second planar shape of an opening end of the second pit is symmetric with respect to each of lines passing through barycenter of the second planar shape and is parallel to either side of the second two-dimensional grating.

17 Claims, 15 Drawing Sheets

(51) Int. Cl.
- *H01S 5/12* (2006.01)
- *H01S 5/187* (2006.01)
- *H01S 5/042* (2006.01)
- *H01S 5/183* (2006.01)
- *H01S 5/30* (2006.01)
- *H01S 5/343* (2006.01)
- *H01S 5/028* (2006.01)

(52) U.S. Cl.
CPC .......... *H01S 5/1215* (2013.01); *H01S 5/1225* (2013.01); *H01S 5/187* (2013.01); *H01S 5/18386* (2013.01); *H01S 5/305* (2013.01); *H01S 5/34313* (2013.01); *H01S 2302/02* (2013.01)

(58) Field of Classification Search
USPC ..................................... 372/45.01, 102, 50.11
See application file for complete search history.

(56) References Cited

U.S. PATENT DOCUMENTS

| | | | |
|---|---|---|---|
| 2008/0285608 A1* | 11/2008 | Hori | B82Y 20/00 372/44.011 |
| 2009/0147818 A1 | 6/2009 | Baumann et al. | |
| 2015/0286006 A1 | 10/2015 | Chang-Hasnain et al. | |
| 2016/0020581 A1 | 1/2016 | Hirose et al. | |
| 2016/0064894 A1 | 3/2016 | Takiguchi et al. | |
| 2016/0380405 A1* | 12/2016 | Takiguchi | H01S 5/026 372/26 |
| 2017/0271849 A1 | 9/2017 | Saito et al. | |

FOREIGN PATENT DOCUMENTS

| | | |
|---|---|---|
| JP | 2010-278326 | 12/2010 |
| JP | 2012-151140 | 8/2012 |
| JP | 2014-197659 | 10/2014 |
| JP | WO 2014/175447 A1 | 10/2014 |
| JP | 6162230 B1 | 8/2017 |
| JP | 2017-168592 | 9/2017 |
| JP | 2017-188700 | 10/2017 |
| JP | 2018-093022 | 6/2018 |

\* cited by examiner

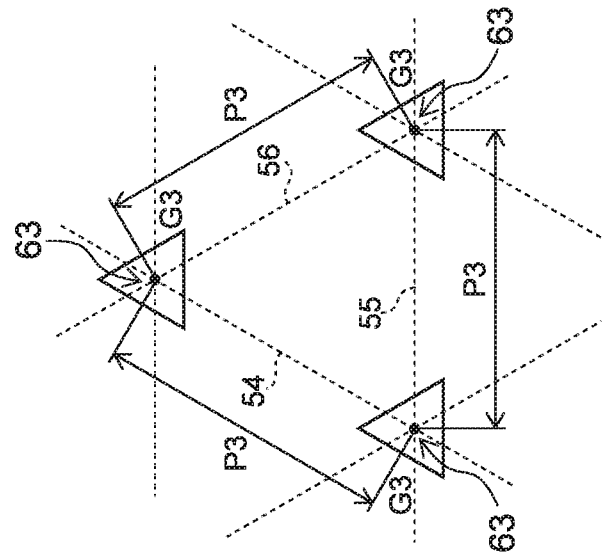
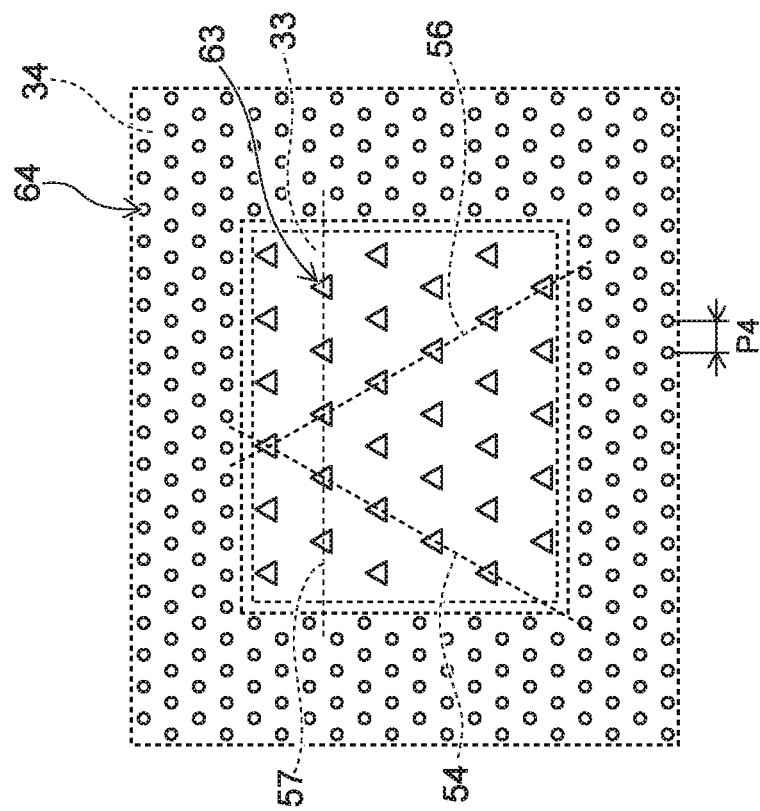
FIG. 14B
FIG. 14A

SURFACE EMITTING QUANTUM CASCADE LASER

CROSS-REFERENCE TO RELATED APPLICATIONS

This application is based upon and claims the benefit of priority from Japanese Patent Application No. 2017-170309, filed on Sep. 5, 2017; the entire contents of which are incorporated herein by reference.

FIELD

Embodiments described herein relate generally a surface emitting quantum cascade laser.

BACKGROUND

A surface emitting quantum cascade laser lases in the TM mode and emits laser light having an infrared to terahertz wavelength.

An optical resonator can be configured from a two-dimensional photonic crystal provided near the active layer. A surface emitting quantum cascade laser having a two-dimensional photonic crystal operates as a surface emitting laser capable of emitting laser light in the direction perpendicular to the surface of the active layer.

The operating current may be increased in order to obtain high output. However, this results in raising the chip operating temperature and increasing the leakage of light from the chip side surface.

BRIEF DESCRIPTION OF THE DRAWINGS

FIG. 14A is a schematic plan view of a surface emitting quantum cascade laser according to a fifth embodiment, and FIG. 14B is a schematic plan view of the internal region including a regular triangular grating.

DETAILED DESCRIPTION

In general, according to one embodiment, a surface emitting quantum cascade laser includes an active layer and a first semiconductor layer. The active layer includes a plurality of quantum well layers stacked therein and is capable of emitting laser light by intersubband transition. The first semiconductor layer is provided on the active layer and has a first surface. The first surface includes an internal region in which first pits constitute a first two-dimensional grating and an outer peripheral region in which second pits constitute a second two-dimensional grating. Grating pitch of the first pits is m times (where m being an integer of 1 or more) grating pitch of the second pits. The outer peripheral region surrounds the internal region. A first planar shape of an opening end of the first pit is asymmetric with respect to a line passing through barycenter of the first planar shape and is parallel to at least one side of the first two-dimensional grating. A second planar shape of an opening end of the second pit is symmetric with respect to each of lines passing through barycenter of the second planar shape and is parallel to either side of the second two-dimensional grating. And the laser light has an emission wavelength corresponds to the grating pitch of the second pits and is emitted in a direction generally perpendicular to the active layer from the internal region.

Embodiments of the invention will now be described with reference to the drawings.

Figure 1:
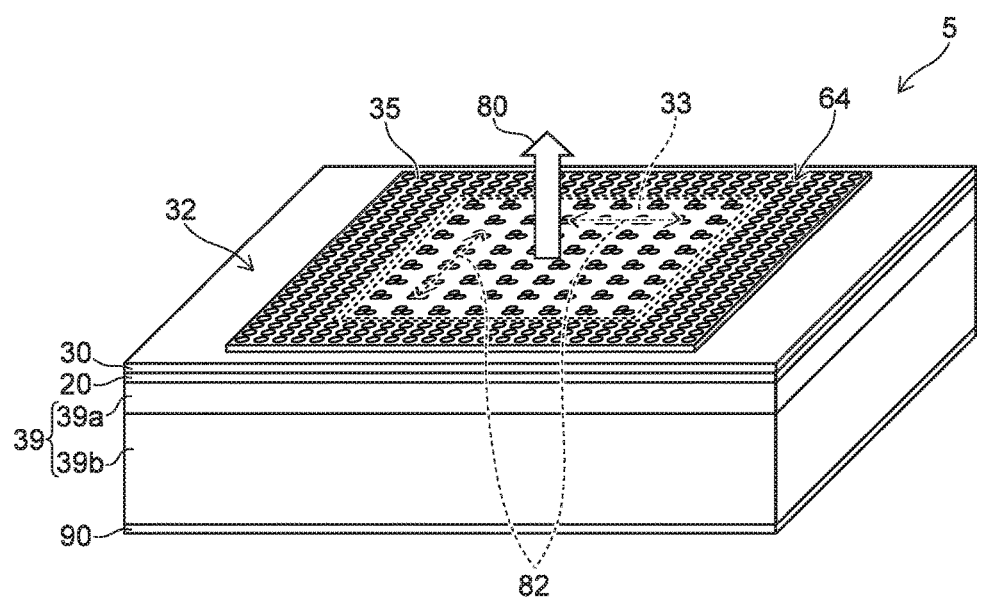
FIG. 1 is a schematic perspective view of a surface emitting quantum cascade laser according to a first embodiment.

FIG. 1 is a schematic perspective view of a surface emitting quantum cascade laser according to a first embodiment.

Figure 2A:
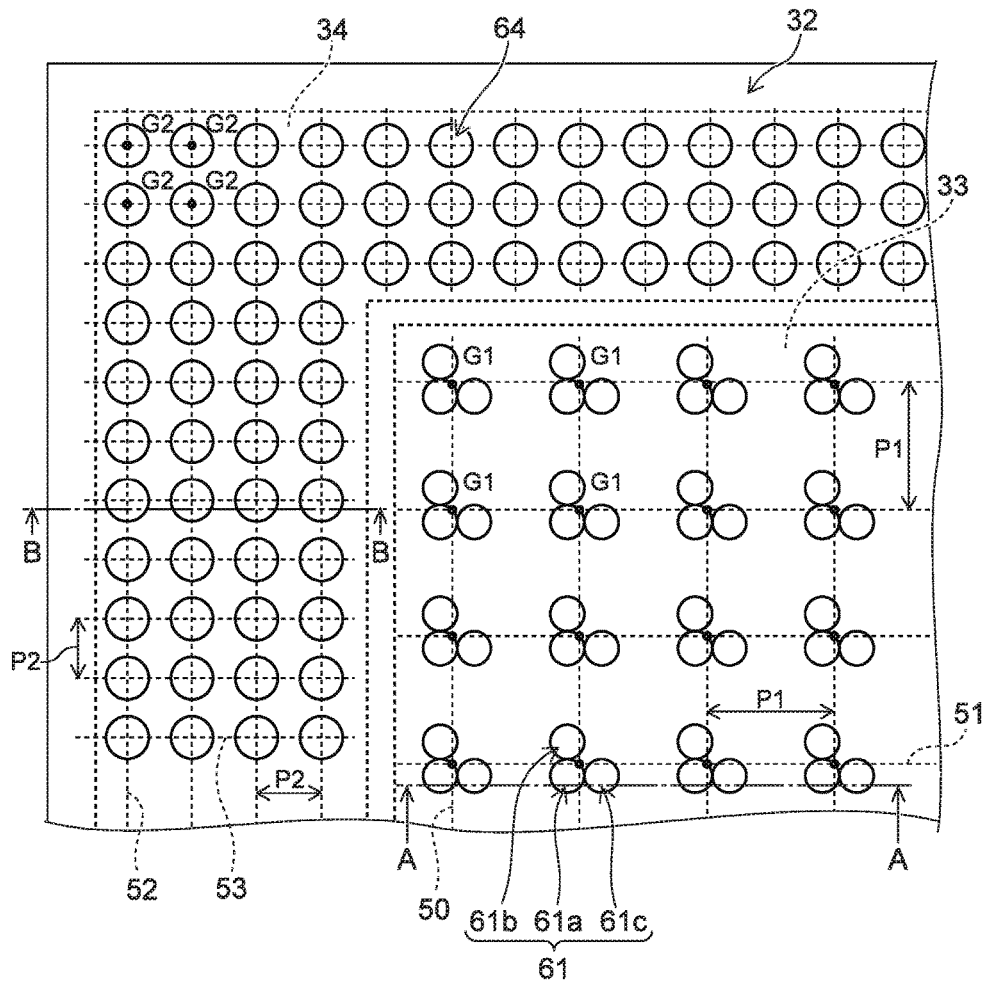
FIG. 2A is a partial schematic plan view of the surface emitting quantum cascade laser according to the first embodiment other than the upper electrode.
Figure 2B:
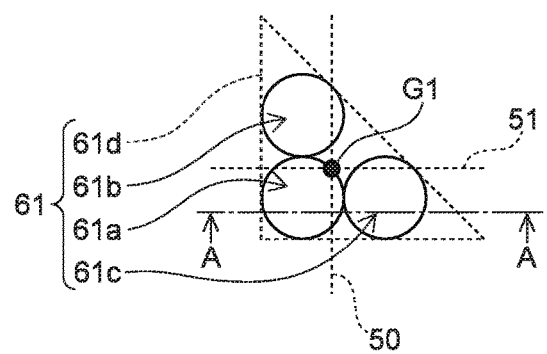
FIG. 2B is a schematic plan view of the first pit.

FIG. 2A is a partial schematic plan view of the surface emitting quantum cascade laser according to the first embodiment other than the upper electrode. FIG. 2B is a schematic plan view of the first pit.

The surface emitting quantum cascade laser 5 includes an active layer 20 and a first semiconductor layer 30. The active layer 20 includes a plurality of quantum well layers stacked therein. The active layer 20 can emit laser light 80 by intersubband transition. The first semiconductor layer 30 is provided on the active layer 20 and has a first surface 32. The first surface 32 includes an internal region 33 and an outer peripheral region 34. In the internal region 33, first pits 61 constitute a first two-dimensional grating. In the outer peripheral region 34, second pits 64 constitute a second two-dimensional grating. The first semiconductor layer 30 can further include e.g. a cladding layer on the active layer 20 side. As shown in FIG. 2A, preferably, the first pits 61 do not overlap the second pits 64. The two-dimensional grating shown in FIGS. 2A and 2B is a square grating. However, it may be a rectangular grating.

The grating pitch P1 of the first pits 61 is twice the grating pitch P2 of the second pits 64. The outer peripheral region 34 surrounds the internal region 33.

The planar shape of the opening end of the first pit 61 is asymmetric with respect to the line (50 or 51) passing through the barycenter G1 of the planar shape and being parallel to at least one side of the first two-dimensional grating. The planar shape of the opening end of the second pit 64 is symmetric with respect to each of the lines passing through the barycenter G2 of the planar shape and being parallel to either side (52 and 53) of the second two-dimensional grating. The laser light 80 is emitted in a direction generally perpendicular to the active layer 20 from the internal region 33. In this specification, the generally perpendicular direction refers to 81° or more and 99° or less with respect to the surface of the active layer 20.

The planar shape of the opening end of the first pit 61 can include a plurality of point-symmetric shapes. For instance, as shown in FIG. 2B, the first pit 61 is formed by cutting out three circular cylinders 61a, 61b, 61c from the first surface 32. In FIG. 2B, the three circular cylinders 61a, 61b, 61c are provided so as to be inscribed in an isosceles right triangle 61d in plan view. However, the embodiments of the invention are not limited thereto. For instance, the circular cylinders do not need to be in contact with each other in plan view. The circular cylinders may be spaced from or overlap each other as long as they act as grating points of a diffraction grating at a prescribed wavelength. The second pit 64 can be shaped like e.g. a circular cylinder (the planar shape being a circle).

The surface emitting quantum cascade laser 5 can further include an upper electrode 35, a second semiconductor layer 39, and a lower electrode 90. The upper electrode 35 is provided on the portion of the internal region 33 not provided with the first pits 61 and the portion of the outer peripheral region 34 not provided with the second pits 64. The second semiconductor layer 39 is provided on the surface of the active layer 20 on the opposite side from the surface provided with the first semiconductor layer 30. The lower electrode 90 is provided on the surface of the second semiconductor layer 39 on the opposite side from the active layer 20 side. The second semiconductor layer 39 can include e.g. a cladding layer 39a and a substrate 39b.

The first semiconductor layer 30 and the second semiconductor layer 39 may each include an n-type layer. Then, electrons serve as carriers causing intersubband transition. The thickness of the first semiconductor layer 30 can be several μm. The thickness of the second semiconductor layer 39 can be several μm.

The carriers pass through the quantum well layer by the electric field applied to the upper electrode 35 and the lower electrode 90. This causes intersubband transition and emits single-mode laser light having a wavelength of 2 to 100 μm.

The grating pitch P1 of the first pits 61 and the grating pitch P2 of the second pits 64 are set to approximately the in-medium wavelength of the laser light 80.

The extraction direction of laser light is now described in a one-dimensional grating for reference. The quantum cascade laser device primarily emits a TM (transverse magnetic) wave. In the waveguide, the angle of diffraction by the diffraction grating is denoted by θ. The order of the diffraction grating is denoted by M (integer). The diffraction order is denoted by m (integer). Then, the following equation holds.

$$\cos\theta = 1 \pm 2\,m/M \quad (1)$$

In the case of the first-order diffraction grating, according to equation (1), the mode of m=0 is emitted in the 0° direction, and the mode of m=1 is emitted in the 180° direction. However, there is no emission in the perpendicular direction.

In the case of the second-order diffraction grating, according to equation (1), the mode of m=1 is scattered in ±90° directions with respect to the waveguide. The modes of m=0 and m=2 are scattered in the direction parallel to the waveguide. Thus, the light is emitted substantially in ±90° directions alone.

Figure 3A:
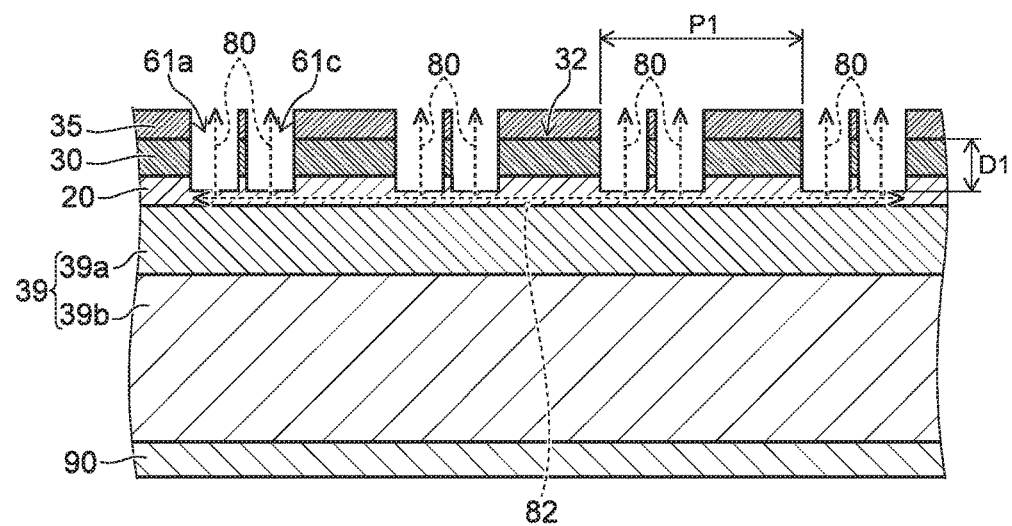
FIG. 3A is a schematic sectional view taken along line A-A of FIG. 2A.
Figure 3B:
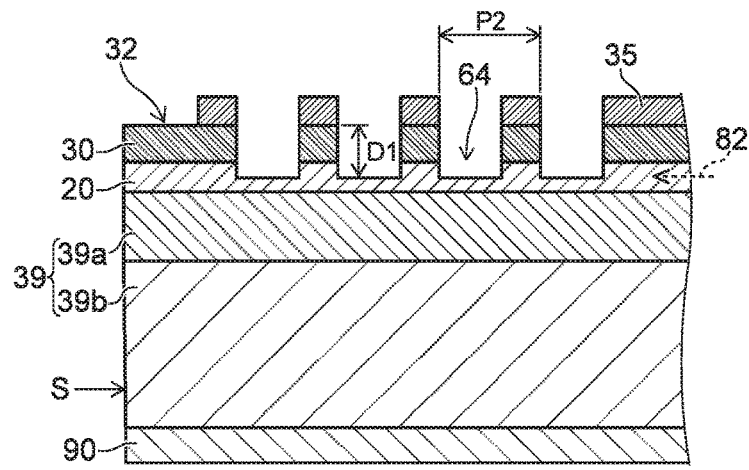
FIG. 3B is a schematic sectional view taken along line B-B of FIG. 2A.

FIG. 3A is a schematic sectional view taken along line A-A of FIG. 2A. FIG. 3B is a schematic sectional view taken along line B-B of FIG. 2A.

As shown in FIG. 3A, the first pits 61 are arranged like a two-dimensional lattice in the internal region 33 including the second-order diffraction grating. The current injected into the active layer 20 causes intersubband transition of carriers. Laser light 82 is generated by the second-order diffraction grating as a resonator. A TM wave linearly polarized in a prescribed direction propagates in the plane parallel to the surface of the active layer 20.

In the first pit 61, the electric field (or magnetic field) integrated in the horizontal plane is nonzero. Thus, the TM wave leaks out in the direction perpendicular to the active layer 20. The TM wave is emitted in a direction generally perpendicular to the active layer 20 while keeping the state linearly polarized in the prescribed direction in the horizontal plane. At this time, the beams of light emitted from respective pits are constructively combined by the two-dimensional grating and emitted in the perpendicular direction. If the planar shape of each first pit 61 is symmetric (e.g. circular) with respect to the line passing through the barycenter and being parallel to either side of the two-dimensional grating, the integration value of the electric field in the horizontal plane is zero in the first pit 61. This decreases the TM wave leaking out in the perpendicular direction. That is, the first pits 61 constituting a second-order diffraction grating can efficiently emit diffraction light in ±90° directions.

As shown in FIG. 3B, the second pits 64 are arranged like a two-dimensional lattice in the outer peripheral region 34 including the first-order diffraction grating. The first grating pitch P1 is made twice the second grating pitch P2. For instance, the second pit 64 is surrounded with InP. Then, the grating pitch P2 is 1.467 μm, and the vacuum wavelength $\lambda_0$ is 4.771 μm. In the outer peripheral region 34, the diffraction direction is limited to the directions parallel to the surface of the active layer 20. Thus, light emitted in the direction perpendicular to the first surface 32 cannot exist in the outer peripheral region 34.

The outer peripheral region 34 functions as a distributed Bragg reflector (DBR). In the DBR, the laser light 82 generated in the active layer 20 and propagated in a direction parallel to the surface of the active layer 20 in the outer peripheral region 34 toward the chip side surface is reflected by the first-order diffraction grating and returned toward the internal region 33. In the outer peripheral region 34, the light intensity of the laser light 82 traveling from the internal region 33 side toward the external side surface S sharply decreases toward the chip side surface S. This can reduce laser light leaking outside from the chip side surface S. As a result, the light emission efficiency can be improved. Furthermore, safety can be improved by suppressing unwanted radiation. A large amount of leakage light is not preferable because the light emission mode is easily changed.

The depth of the first pit 61 shown in FIG. 3A is set to D1. The depth of the second pit 64 shown in FIG. 3B is also set to D1. The depth of the pit reaches the active layer 20. A recess is provided on the upper surface side of the active layer 20. An excessively deep recess of the active layer 20 tightens optical coupling with the photonic crystal, but is not preferable because it decreases the number of stacked quantum well layers.

The active layer 20 has a configuration in which intersubband transition light emission regions and relaxation regions are stacked alternately. The intersubband transition light emission region is made of a quantum well layer including a well layer and a barrier layer. The quantum well includes e.g. a well layer made of Si-doped $In_{0.669}Ga_{0.331}As$ and a barrier layer made of Si-doped $In_{0.362}Al_{0.638}As$. Preferably, e.g. 50-200 layers of a multi-quantum well (MQW) structure are stacked in the quantum well layer. The MQW structure is a unit structure in which at least two well layers and a plurality of barrier layers are further stacked alternately. The thickness of the active layer 20 can be e.g. 1-4 μm. The relaxation region can also include a quantum well layer. The second semiconductor layer 39 can further include a substrate 39b made of e.g. InP or GaAs.

Figure 4A:
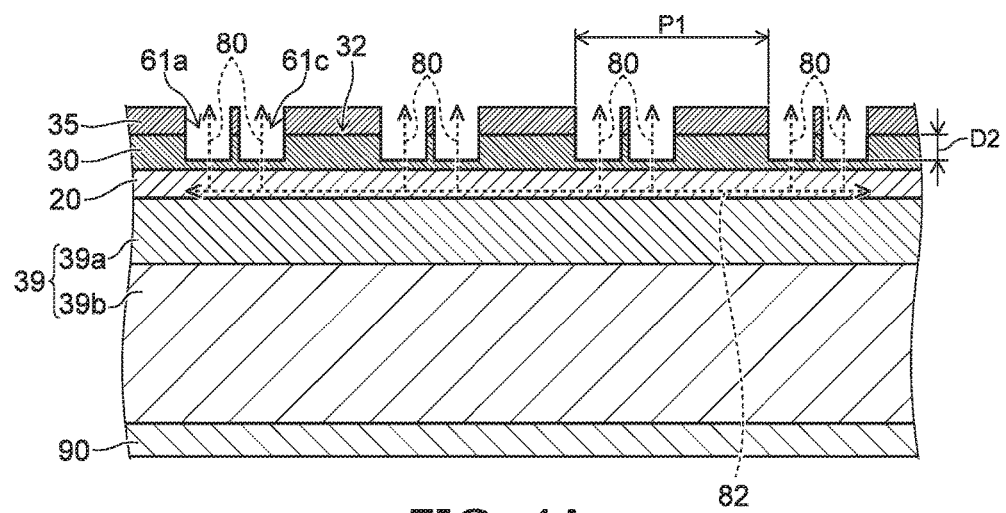
FIG. 4A is a schematic sectional view of the internal region according to a first variation of the first embodiment.
Figure 4B:
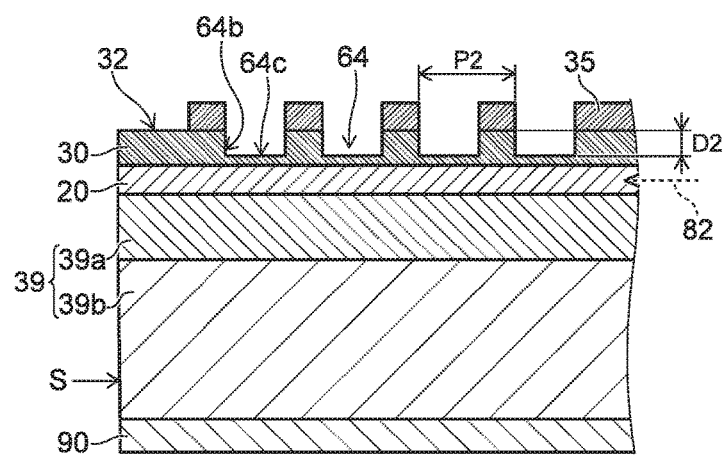
FIG. 4B is a schematic sectional view of the outer peripheral region.

FIG. 4A is a schematic sectional view of the internal region according to a first variation of the first embodiment. FIG. 4B is a schematic sectional view of the outer peripheral region.

The depth of the first pit 61 of the internal region 33 shown in FIG. 4A is set to D2. The depth of the second pit 64 of the outer peripheral region 34 shown in FIG. 4B is also set to D2. In this variation, the pit depth D2 is smaller than the thickness of the first semiconductor layer 30. The bottom surface of the first pit 61 and the second pit 64 does not reach the active layer 20. Optical coupling between the active layer 20 and the two-dimensional grating is possible if the spacing between the bottom surface of the first pit 61 (61a, 61b, 61c) and the surface of the active layer 20 and the spacing between the bottom surface of the second pit 64 and the active layer 20 are e.g. several μm or less.

Figure 5A:
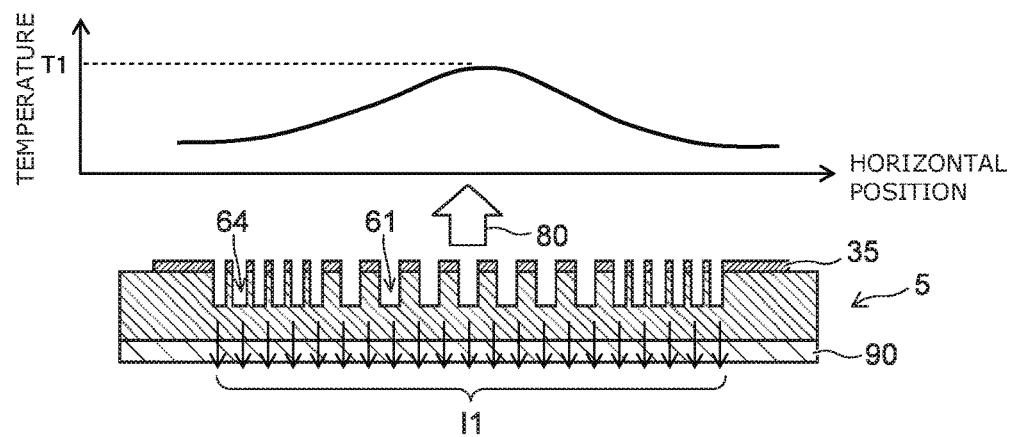
FIG. 5A is a graph showing the temperature distribution of the surface emitting quantum cascade laser according to the first embodiment.
Figure 5B:
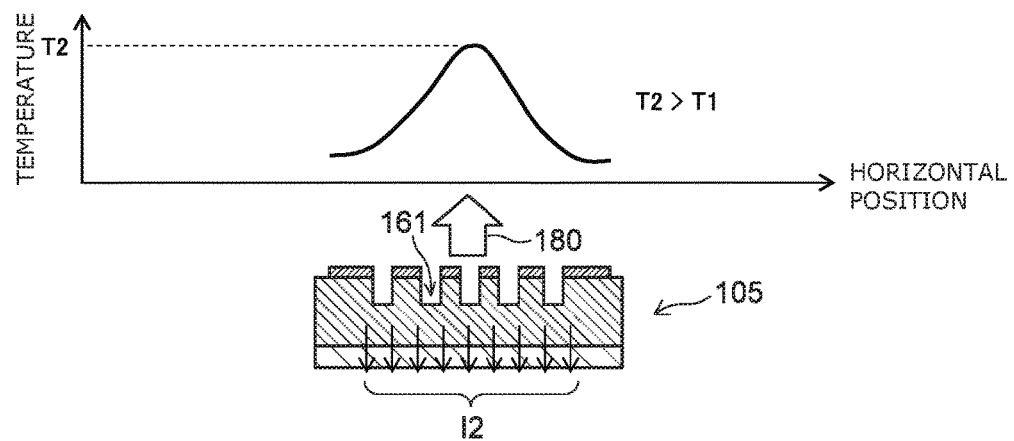
FIG. 5B is a graph showing the temperature distribution of the surface emitting quantum cascade laser according to a comparative example.

FIG. 5A is a graph showing the temperature distribution of the surface emitting quantum cascade laser according to the first embodiment. FIG. 5B is a graph showing the temperature distribution of the surface emitting quantum cascade laser according to a comparative example.

In FIGS. 5A and 5B, the vertical axis represents temperature, and the horizontal axis represents the horizontal position in the chip cross section. As shown in FIG. 5B, the surface emitting quantum cascade laser 105 according to the comparative example includes a photonic crystal constituting a second-order diffraction grating arranged like a two-dimensional lattice. The planar shape of the pit of the second-order diffraction grating is made asymmetric with respect to the line passing through the barycenter of the planar shape and being parallel to at least one side of the two-dimensional grating.

The injection current I1 of the first embodiment is equal to the injection current I2 of the comparative example 105. The extracted laser optical output is made generally equal to each other. In the first embodiment, the outer peripheral region 34 is provided so as to surround the internal region 33 constituting the light extraction region. Thus, the area of the active layer 20 is larger than the area of the active layer of the comparative example 105. The thermal resistance of the first embodiment is lower than the thermal resistance of the comparative example 105. The peak temperature T1 in the active layer 20 can be made lower than the peak temperature T2 in the active layer of the comparative example 105. This can reduce the refractive index change in the active layer 20, thereby stabilizing the lasing mode. This also suppresses the decrease of efficiency and the increase of failure rate due to temperature increase.

The laser light traveling downward from the active layer is reflected by the lower electrode 90 and combined with the laser light traveling upward from the active layer 20 to constitute laser light 80. The laser light 80 is emitted from the upper side.

Figure 6:
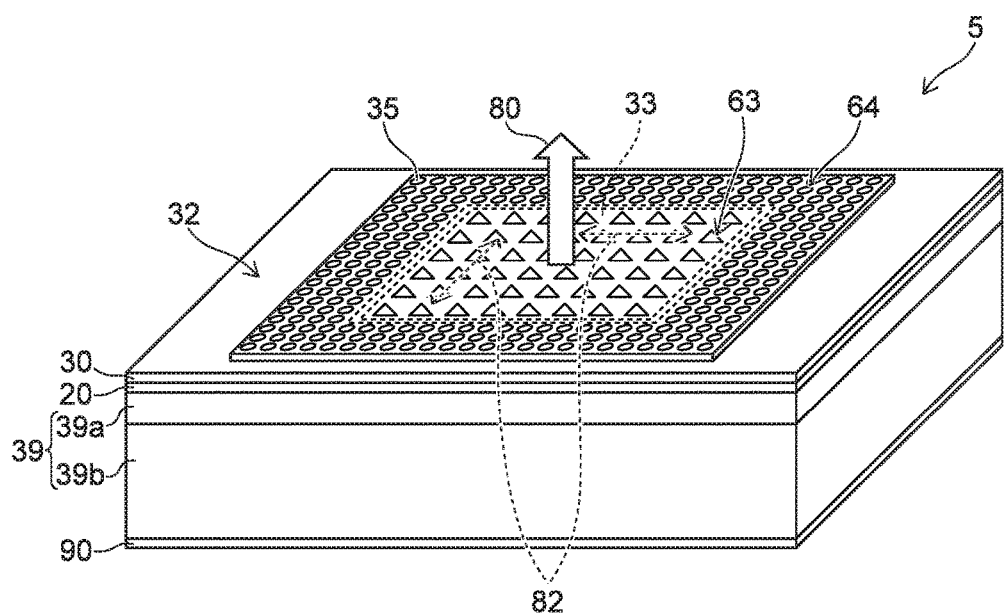
FIG. 6 is a schematic perspective view of a surface emitting quantum cascade laser according to a second embodiment.

FIG. 6 is a schematic perspective view of a surface emitting quantum cascade laser according to a second embodiment.

Figure 7:
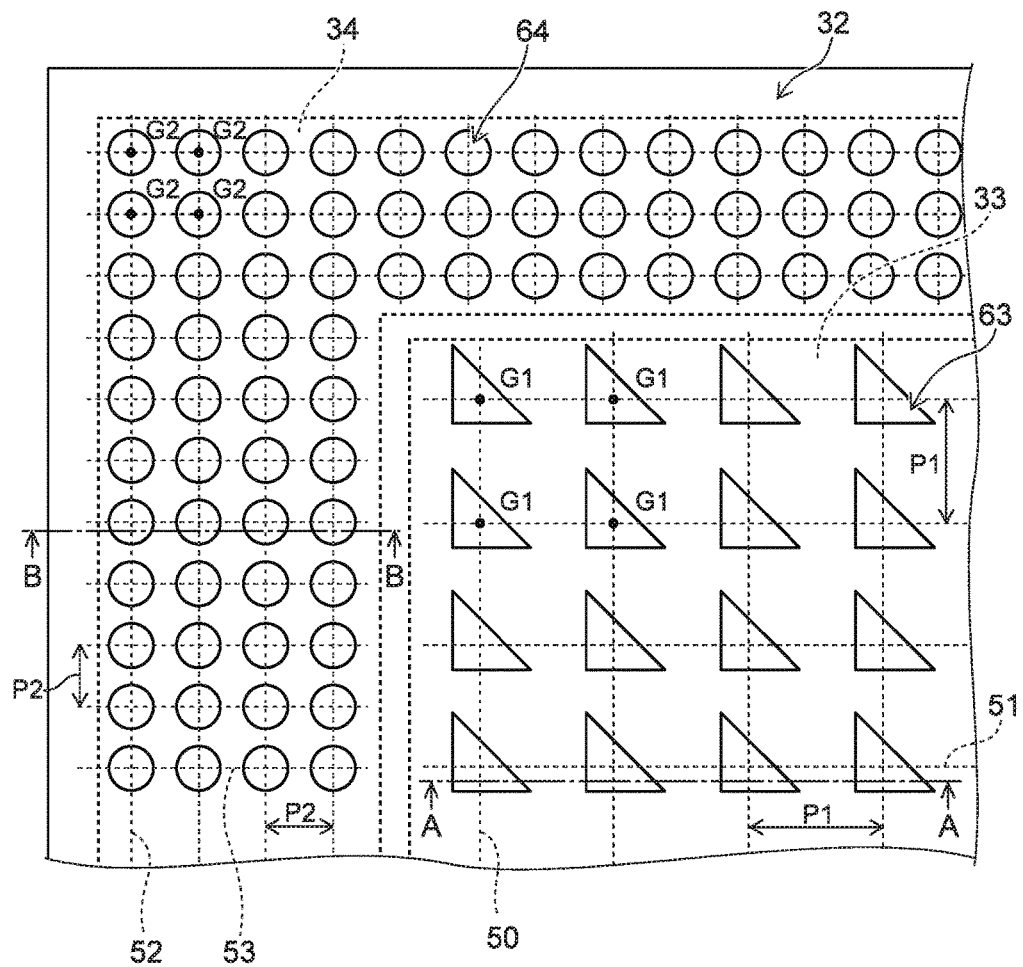
FIG. 7 is a partial schematic plan view of the surface emitting quantum cascade laser according to the second embodiment other than the upper electrode.

FIG. 7 is a partial schematic plan view of the surface emitting quantum cascade laser according to the second embodiment other than the upper electrode.

The surface emitting quantum cascade laser 5 includes an active layer 20 and a first semiconductor layer 30. The first surface 32 includes an internal region 33 and an outer peripheral region 34. In the internal region 33, first pits 63 constitute a first two-dimensional grating. In the outer peripheral region 34, second pits 64 constitute a second two-dimensional grating. As shown in FIG. 7, preferably, the first pits 63 do not overlap the second pits 64.

The grating pitch P1 of the first pits 63 is twice the grating pitch P2 of the second pits 64. The outer peripheral region 34 surrounds the internal region 33.

The planar shape of the opening end of the first pit 63 is asymmetric with respect to the line (50 or 51) passing through the barycenter G1 of the planar shape and being parallel to at least one side of the first two-dimensional grating. The planar shape of the opening end of the second pit 64 is symmetric with respect to each of the lines passing through the barycenter G2 of the planar shape and being parallel to either side (52 and 53) of the second two-dimensional grating. The laser light 80 is emitted in a direction generally perpendicular to the active layer 20 from the internal region 33.

In FIGS. 6 and 7, the first pit 63 is a right triangular prism (the planar shape being an isosceles right triangle). The second pit 64 is a circular cylinder (the planar shape being a circle). However, the planar shape of the first pit 63 is not limited to an isosceles right triangle as long as it is asymmetric.

When the two-dimensional grating is a square grating or rectangular grating, the first planar shape of the opening end of the first pit 63 (not limited to a circle or triangle) is made asymmetric with respect to the line (50 or 51) passing through the barycenter G1 of the first planar shape and being parallel to each of the two sides of the first two-dimensional grating. This is more preferable because the optical anisotropy is further enhanced.

The surface emitting quantum cascade laser 5 can further include an upper electrode 35, a second semiconductor layer 39, and a lower electrode 90. The upper electrode 35 is provided on the portion of the internal region 33 not provided with the first pits 63 and the portion of the outer peripheral region 34 not provided with the second pits 64. The second semiconductor layer 39 is provided on the surface of the active layer 20 on the opposite side from the surface provided with the first semiconductor layer 30. The lower electrode 90 is provided on the surface of the second semiconductor layer 39 on the opposite side from the active layer 20 side.

The grating pitch P1 of the first pits 63 and the grating pitch P2 of the second pits 64 are set to approximately the in-medium wavelength of the laser light 80.

Figure 8A:
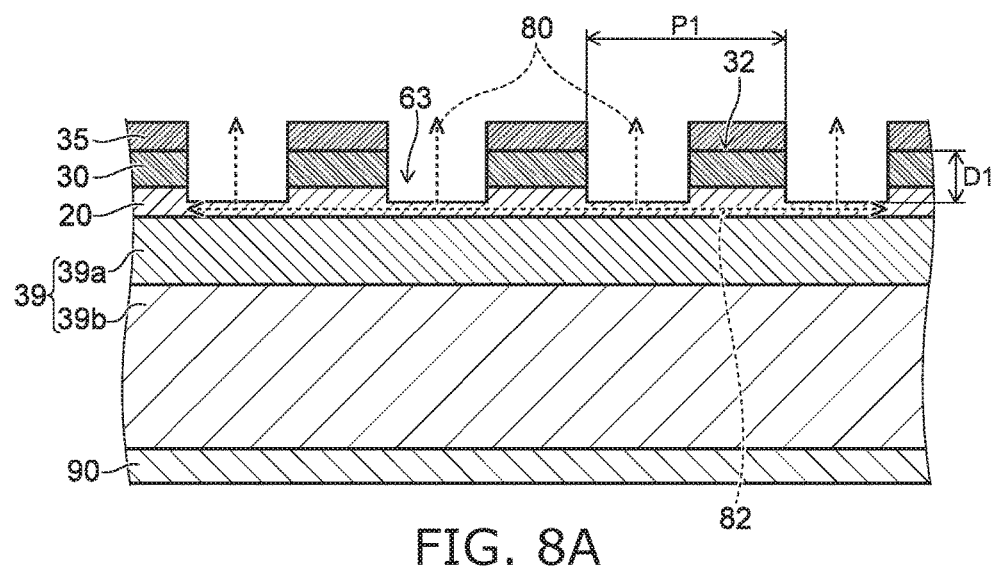
FIG. 8A is a schematic sectional view taken along line A-A of FIG. 7.
Figure 8B:
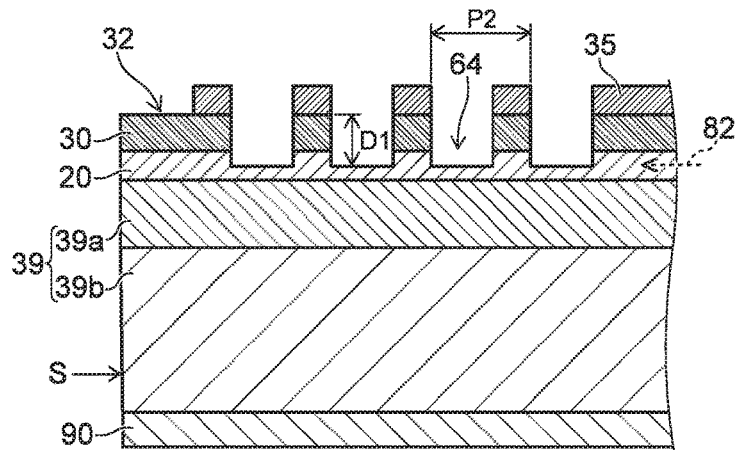
FIG. 8B is a schematic sectional view taken along line B-B of FIG. 7.

FIG. 8A is a schematic sectional view taken along line A-A of FIG. 7. FIG. 8B is a schematic sectional view taken along line B-B of FIG. 7.

The first pits 63 are arranged like a two-dimensional lattice in the internal region 33 including the second-order diffraction grating. The current injected into the active layer 20 causes intersubband transition of carriers. Laser light 82 is generated by the second-order diffraction grating as a resonator. A TM wave linearly polarized in a prescribed direction propagates in the plane parallel to the surface of the active layer 20.

Figure 9A:
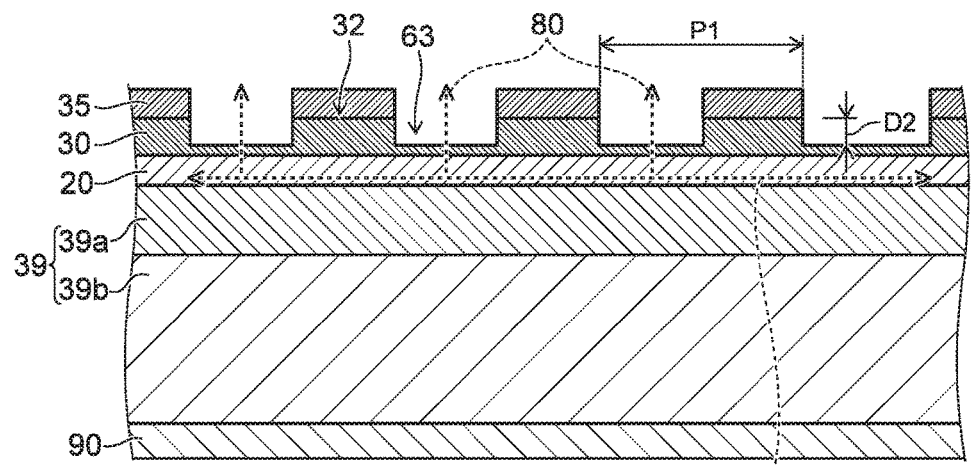
FIG. 9A is a schematic sectional view of the internal region according to a first variation of the second embodiment.
Figure 9B:
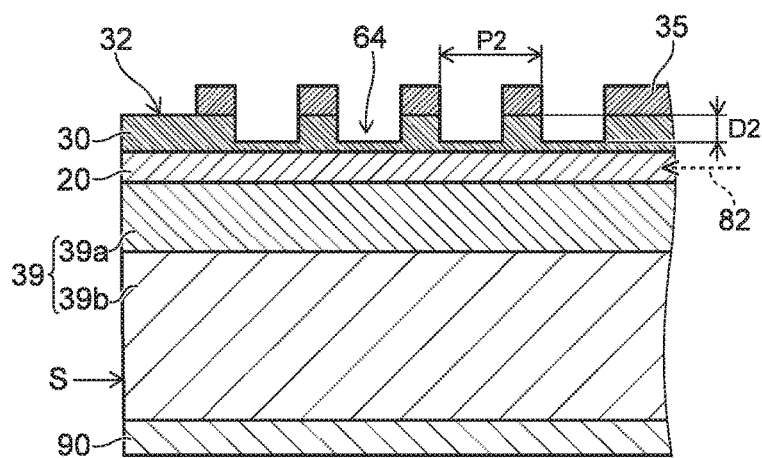
FIG. 9B is a schematic sectional view of the outer peripheral region.

FIG. 9A is a schematic sectional view of the internal region according to a first variation of the second embodiment. FIG. 9B is a schematic sectional view of the outer peripheral region.

The depth of the first pit of the internal region 33 shown in FIG. 9A is set to D2. The depth of the second pit of the outer peripheral region 34 shown in FIG. 9B is also set to D2. In this variation, the depth D2 of the first pit 63 and the second pit 64 is smaller than the thickness of the first semiconductor layer 30. The bottom surface of the first pit 63 and the second pit 64 does not reach the active layer 20. Optical coupling between the active layer 20 and the two-dimensional grating is possible if the spacing between the bottom surface of the first pit 63 and the surface of the active layer 20 and the spacing between the bottom surface of the second pit 64 and the active layer 20 are e.g. several μm or less.

Figure 10:
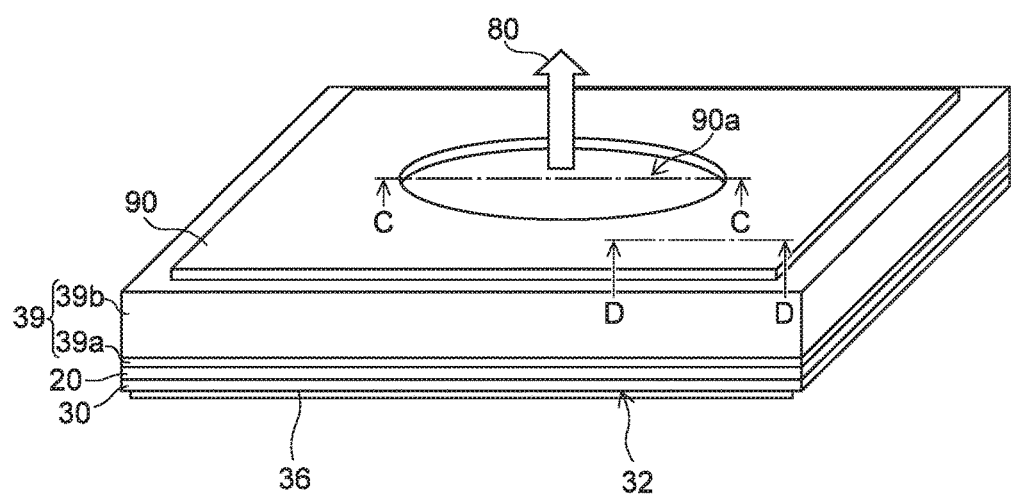
FIG. 10 is a schematic perspective view of a surface emitting quantum cascade laser according to a third embodiment.

FIG. 10 is a schematic perspective view of a surface emitting quantum cascade laser according to a third embodiment.

Figure 11A:
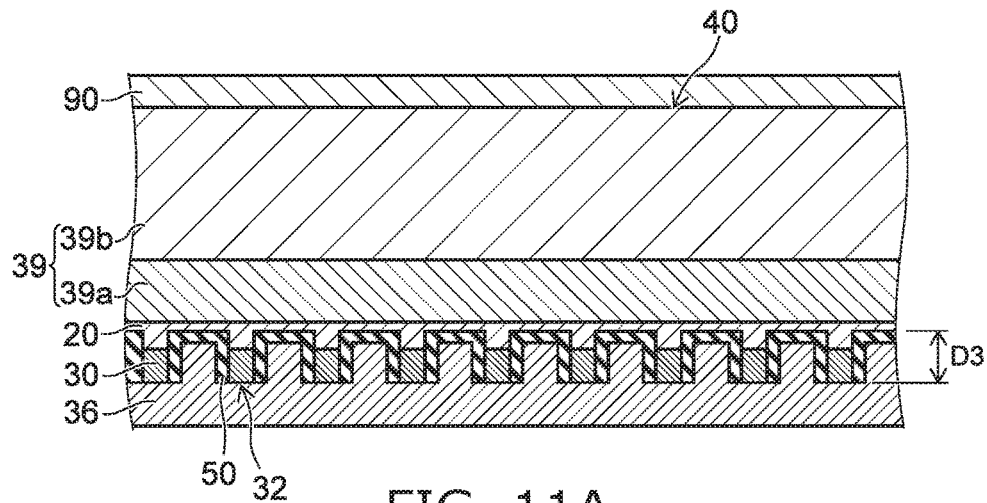
FIG. 11A is a schematic sectional view taken along line C-C of FIG. 10.
Figure 11B:
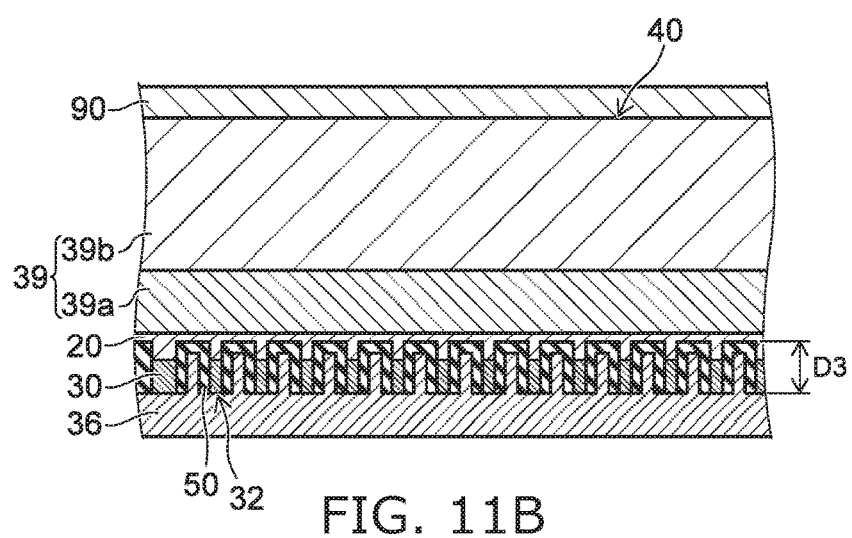
FIG. 11B is a schematic sectional view taken along line D-D of FIG. 10.
Figure 11C:
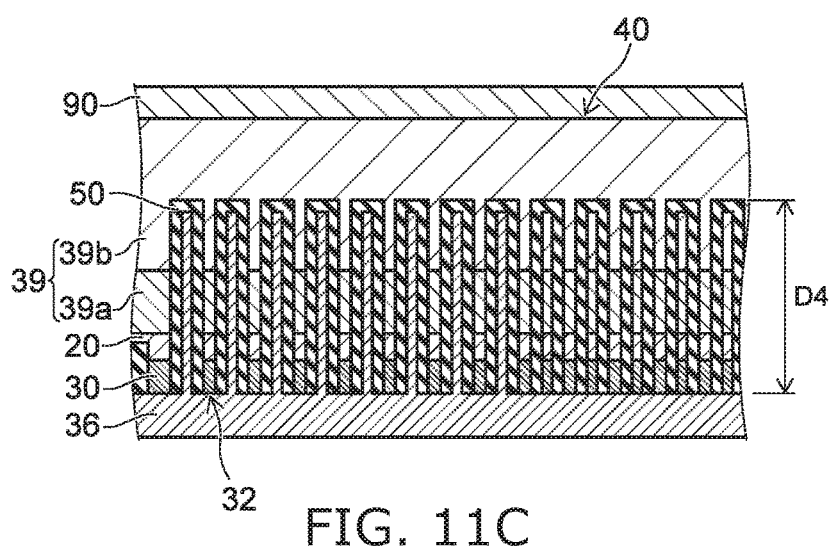
FIG. 11C shows a variation of the second pit, and is a schematic sectional view taken along line D-D of FIG. 10.

FIG. 11A is a schematic sectional view taken along line C-C of FIG. 10. FIG. 11B is a schematic sectional view taken along line D-D of FIG. 10. FIG. 11C shows a variation of the second pit, and is a schematic sectional view taken along line D-D of FIG. 10.

The first surface 32 of the first semiconductor layer 30 is identical to the first surface 32 shown in FIG. 6. As shown in FIG. 11A, an insulator layer 50 is provided so as to cover the inner surface (side surface and bottom surface) of the first pit 63 of the internal region 33 and the inner surface (side surface 64b and bottom surface) of the second pit 64 of the outer peripheral region 34. An upper electrode 36 is provided so as to cover the portion of the first surface 32 of the first semiconductor layer 30 not covered with the insulator layer 50 and the surface of the insulator layer 50. In this case, the internal region 33 functions as a periodic structure for surface emission. The insulator layer 50 can be made of e.g. $Si_3N_4$, $SiO_2$, ZnSe, or CdTe.

The lower electrode 90 is provided with an opening 90a so as to overlap part of the internal region 33 in plan view. Thus, the laser light 80 emitted from the photonic crystal constituting a two-dimensional grating is reflected by the upper electrode 36 and passes again through the active layer 20. The laser light 80 is combined with the laser light traveling directly from the active layer 20 toward the opening 90a. Thus, the laser light 80 is emitted in a generally perpendicular direction from the opening 90a.

The first pit 63 and the second pit 64 are filled with the upper electrode 36 via the insulator layer 50. Thus, the generated heat is easily ejected outside from the upper electrode 36 through e.g. a heat sink. This further reduces the peak temperature in the active layer 20.

FIG. 11C shows a variation of the second pit. FIG. 11C shows a trench structure in which the groove of part of the second pits 64 of the outer peripheral region 34 is deep. For instance, for a wavelength of 5 μm, the depth D4 of the groove is set to e.g. 5-10 μm. This enhances the reflectance and increases the optical loss. A high reflectance can be achieved even if the number of grooves arranged along the direction toward the chip side surface of the two-dimensional grating of the second region 34 is decreased to several grooves. Thus, the chip size can be reduced.

Figure 12:
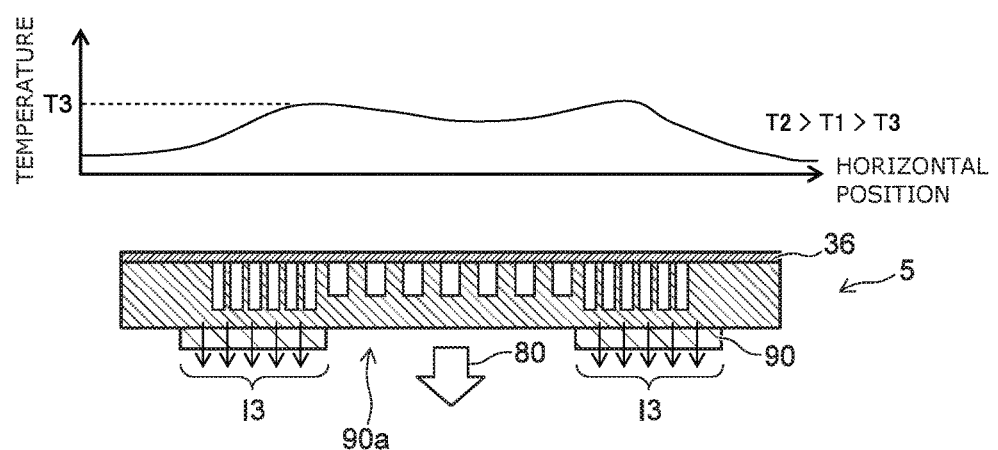
FIG. 12 is a graph illustrating the temperature distribution in the active layer of the surface emitting quantum cascade laser according to the third embodiment.

FIG. 12 is a graph illustrating the temperature distribution in the active layer of the surface emitting quantum cascade laser according to the third embodiment.

The vertical axis represents temperature, and the horizontal axis represents the horizontal position. The opening 90a is provided in the central part of the lower electrode 90. Then, in the injection current I3, the injection current of the internal region 33 can be made lower than the injection current of the outer peripheral region 34. As a result, the generated heat in the internal region 33 is reduced, and the heat source can be distributed outward. Thus, the temperature distribution can be made close to a double-humped distribution. This can further suppress the temperature increase in the internal region 33. The injection current I3 may be made equal to the injection current I1 of the first embodiment. Then, the peak temperature T3 can be made lower than the peak temperature T1 of FIG. 5A (T2>T1>T3). In the laser light generated in the active layer, the light traveling upward is reflected by the upper electrode 36 and emitted from the opening 90a as laser light 80.

Figure 13A:
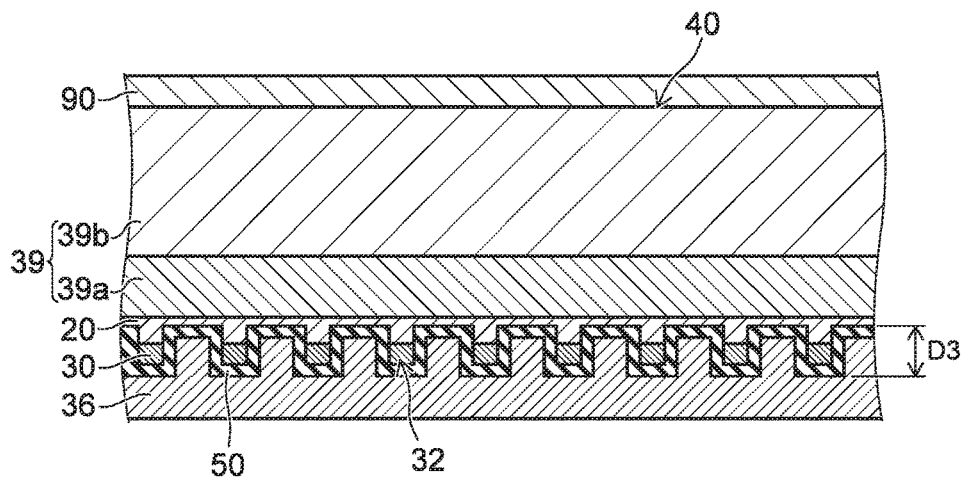
FIG. 13A is a schematic sectional view of the internal region of the fourth embodiment.
Figure 13B:
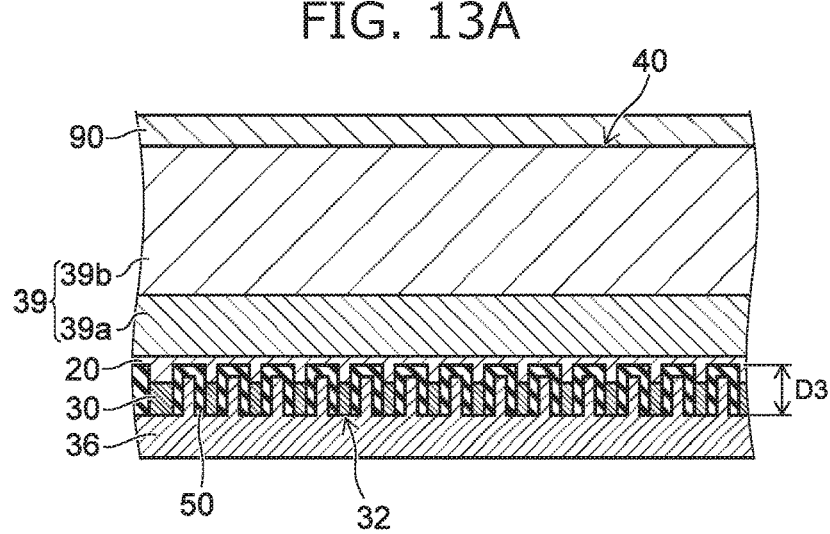
FIG. 13B is a schematic sectional view of the outer peripheral region of the fourth embodiment.
Figure 13C:
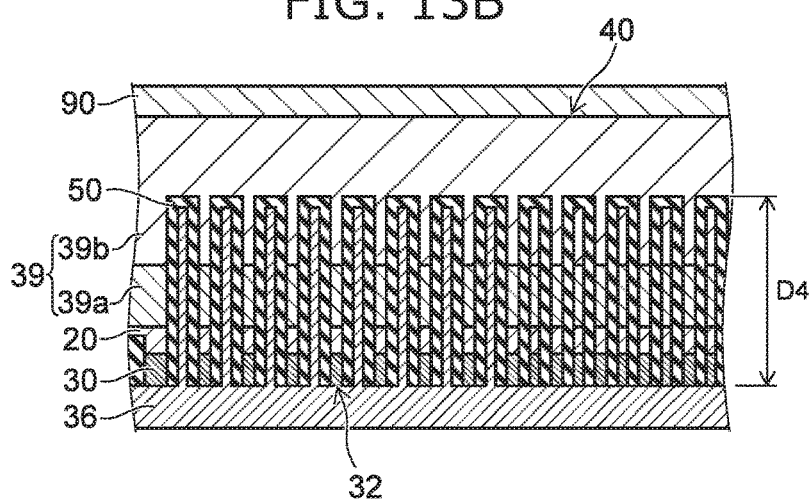
FIG. 13C is a schematic sectional view of the outer peripheral region of a variation of the fourth embodiment.

FIG. 13A is a schematic sectional view of the internal region of the fourth embodiment. FIG. 13B is a schematic sectional view of the outer peripheral region of the fourth embodiment. FIG. 13C is a schematic sectional view of the outer peripheral region of a variation of the fourth embodiment.

FIG. 13A is a schematic sectional view taken along line C-C of FIG. 10. FIGS. 13B and 13C are schematic sectional views taken along line D-D of FIG. 10.

The first surface 32 of the first semiconductor layer 30 is identical to the first surface 32 shown in FIG. 6. As shown in FIG. 13A, an insulator layer 50 is provided so as to cover the inner surface (side surface and bottom surface) of the first pit 63 of the internal region 33, the inner surface (side surface and bottom surface) of the second pit 64 of the outer peripheral region 34, and the first surface 32 of the first semiconductor layer 30. Furthermore, an upper electrode 36 is provided so as to cover the surface of the insulator layer 50. In this case, the internal region 33 functions as a periodic structure for surface emission. The insulator layer 50 can be made of e.g. $Si_3N_4$, $SiO_2$, ZnSe, or CdTe.

The lower electrode 90 is provided with an opening 90a in the portion including part of the internal region 33 in plan view. Thus, the laser light 80 emitted from the photonic crystal constituting a two-dimensional grating is reflected by the upper electrode 36 and passes again through the active layer 20. The laser light 80 is combined with the laser light traveling from the active layer 20 toward the opening 90a. Thus, the laser light 80 is emitted in a generally perpendicular direction from the opening 90a.

The first pit 63 and the second pit 64 are filled with the upper electrode 36 via the insulator layer 50. Thus, the generated heat is easily ejected outside from the upper electrode 36 through e.g. a heat sink. This further reduces the peak temperature in the active layer 20.

FIG. 13C shows a trench structure in which the groove of part of the second pits 64 of the outer peripheral region 34 is deep. For instance, for a wavelength of 5 µm, the depth D4 of the groove is set to e.g. 5-10 µm. This enhances the reflectance and increases the optical loss. A high reflectance can be achieved even if the number of grooves arranged along the direction toward the chip side surface of the two-dimensional grating of the second region 34 is decreased to several grooves. Thus, the chip size can be reduced.

The conventional p-n junction laser diode (LD) emits light by recombination of electrons and holes. The light emitting layer of the p-n junction laser diode acts as a light absorbing layer for the emission wavelength when the current injection density is low. Thus, if the light emitting layer has any region where no current injection is performed, the region constitutes a light absorbing region. This incurs loss of performance such as increase of the threshold current of the laser. On the other hand, in the light emitting layer of the quantum cascade laser, the light absorption is very low for the emission wavelength even in the state of no current injection. Thus, light absorption of the region of no current injection does not lower the performance. Accordingly, there is no performance loss in the structure like the present embodiment in which the internal region 33 is used for light extraction without performing current injection, and the current injection is performed in the outer peripheral region 34.

In this structure, the laser light generated in the outer peripheral region 34 can be collected in a region of the internal region 33 having high mode controllability. Then, the light can be extracted as single-mode light from the internal region 33. Collection of light increases light density. However, because there is no current injection, the temperature increase and the temperature difference are smaller than in the current injection region. Thus, stable lasing can be expected. The area of the outer peripheral region 34 generating light can be made larger than the area of the internal region 33 subjected to mode control and capable of light extraction. This can reduce the current density of the outer peripheral region and improve heat dissipation. Thus, the operation at high output is significantly stabler than that of the conventional p-n junction laser diode.

FIG. 14A is a schematic plan view of a surface emitting quantum cascade laser according to a fifth embodiment. FIG. 14B is a schematic plan view of the internal region including a regular triangular grating.

In the internal region 33, a second-order diffraction grating is formed from first pits 63 having a planar shape of a regular triangle. The first pits 63 are arranged so as to be asymmetric with respect to the lines 54, 55, 56 passing through the barycenter G3 of the planar shape and being parallel to the three sides of the regular triangular grating. The planar shape of the first pit 63 does not need to be a regular triangle. The outer peripheral region 34 is formed as a regular triangular grating in which the second pit 64 has a circular planar shape. The grating pitch P3 of the internal region 33 is made twice the grating pitch P4 of the outer peripheral region 34. Laser light can be emitted in a direction generally perpendicular to the internal region 33.

Figure 15:
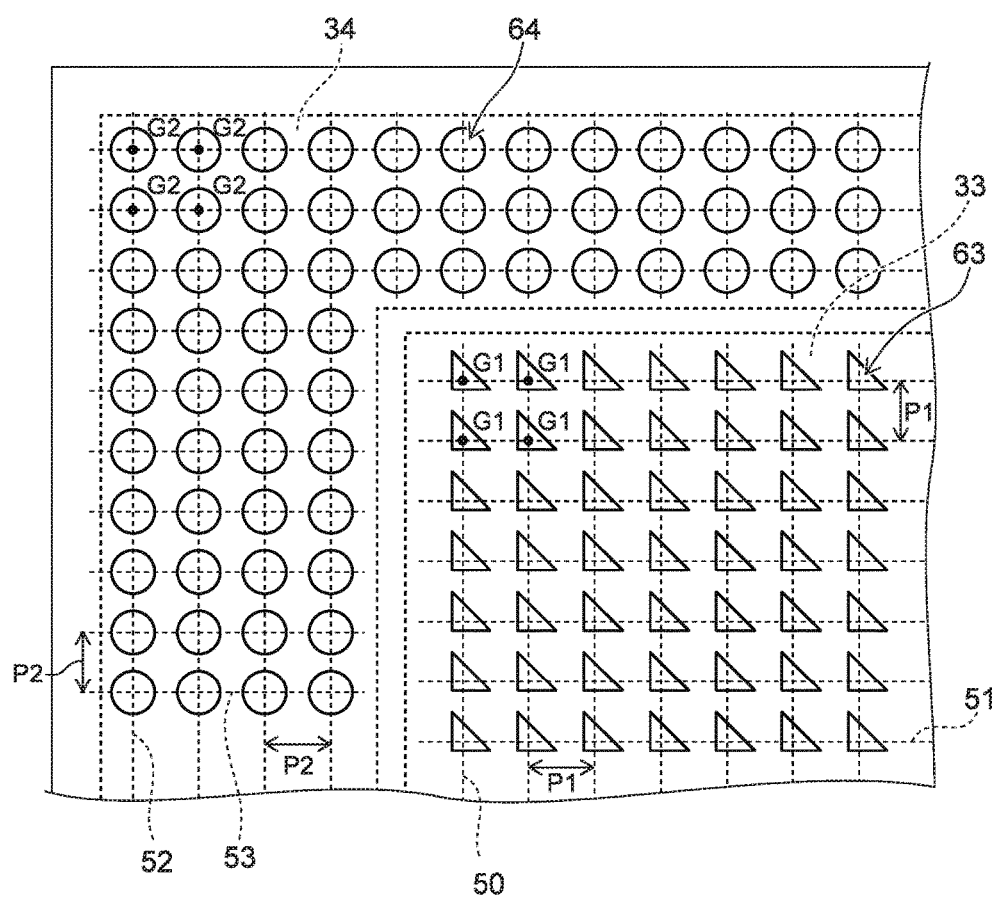
FIG. 15 is a schematic plan view of a surface emitting quantum cascade laser according to a sixth embodiment.

FIG. 15 is a schematic plan view of a surface emitting quantum cascade laser according to a sixth embodiment.

The planar shape of the first pit 63 is asymmetric with respect to the line (50 or 51) passing through the barycenter G1 of the planar shape and being parallel to at least one side of the first two-dimensional grating. The planar shape of the second pit 64 is symmetric with respect to each of the lines passing through the barycenter G2 of the planar shape and being parallel to either side (50 and 51) of the second two-dimensional grating.

In this variation, the two-dimensional grating is a square grating. The grating pitch P1 of the second pits 64 is equal to the grating pitch P1 of the first pits 63. Both of these pits act as a photonic crystal of a first-order diffraction grating. Using the asymmetry of the first pits 63, the internal region 33 emits laser light in a direction generally perpendicular to the active layer by the first-order diffraction grating. In the outer peripheral region 34, using the symmetry of the second pits 64, the laser light emitted from the internal region 33 toward the outer peripheral region 34 can be reflected by the outer peripheral region 34 and returned to the internal region 33 in the plane parallel to the active layer.

The first to sixth embodiments and the variations associated therewith provide surface emitting quantum cascade lasers in which heat dissipation is improved and leakage of light from the chip side surface is reduced. These surface emitting quantum cascade lasers can be widely used in e.g. environmental analysis devices, hazardous material detection devices, and laser processing devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A surface emitting quantum cascade laser comprising:
   an active layer including a plurality of quantum well layers stacked therein and being capable of emitting laser light by intersubband transition; and
   a first semiconductor layer provided on the active layer and having a first surface, the first surface including an internal region in which first pits constitute a first two-dimensional grating and an outer peripheral region in which second pits constitute a second two-dimensional grating, grating pitch of the first pits being m times (where m being an integer of 1 or more) grating pitch of the second pits, and the outer peripheral region surrounding the internal region,
   a first planar shape of an opening end of the first pit being asymmetric with respect to a line passing through barycenter of the first planar shape and being parallel to at least one side of the first two-dimensional grating,
   a second planar shape of an opening end of the second pit being symmetric with respect to each of lines passing through barycenter of the second planar shape and being parallel to either side of the second two-dimensional grating, and
   the laser light having an emission wavelength corresponding to the grating pitch of the second pits and being emitted in a direction generally perpendicular to the active layer from the internal region.

2. The laser according to claim 1, wherein the grating pitch of the first pits is twice the grating pitch of the second pits.

3. The laser according to claim 2, further comprising:
an upper electrode provided on a portion of the internal region not provided with the first pits and a portion of the outer peripheral region not provided with the second pits;
a second semiconductor layer provided on a surface of the active layer on opposite side from a surface provided with the first semiconductor layer; and
a lower electrode provided on a surface of the second semiconductor layer on opposite side from the active layer side.

4. The laser according to claim 3, wherein an inner surface of the first pit and an inner surface of the second pit are each covered with an insulator layer.

5. The laser according to claim 2, wherein an inner surface of the first pit and an inner surface of the second pit are each covered with an insulator layer.

6. The laser according to claim 1, further comprising:
an upper electrode provided on a portion of the internal region not provided with the first pits and a portion of the outer peripheral region not provided with the second pits;
a second semiconductor layer provided on a surface of the active layer on opposite side from a surface provided with the first semiconductor layer; and
a lower electrode provided on a surface of the second semiconductor layer on opposite side from the active layer side.

7. The laser according to claim 6, wherein an inner surface of the first pit and an inner surface of the second pit are each covered with an insulator layer.

8. The laser according to claim 1, wherein an inner surface of the first pit and an inner surface of the second pit are each covered with an insulator layer.

9. The laser according to claim 8, wherein
a portion of the internal region not provided with the first pits and a surface of the insulator layer in the first pits are covered with the upper electrode, and a portion of the outer peripheral region not provided with the second pits and a surface of the insulator layer in the second pits are each covered with the upper electrode, and
the lower electrode is provided with an opening in a portion including part of the internal region in plan view.

10. The laser according to claim 9, wherein depth of the first pit reaches into the active layer.

11. The laser according to claim 9, wherein depth of the second pit reaches into the active layer or penetrates through the active layer.

12. The laser according to claim 1, wherein depth of the first pit is smaller than depth of the second pit.

13. The laser according to claim 12, wherein the depth of the first pit reaches into the active layer.

14. The laser according to claim 1, wherein the first pits do not overlap the second pits in plan view.

15. The laser according to claim 1, wherein the first planar shape includes a plurality of point-symmetric shapes.

16. The laser according to claim 1, wherein
the two-dimensional grating of the first pits is a square grating or a rectangular grating, and
the first planar shape of the opening end of the first pit is asymmetric with respect to a line passing through the barycenter of the first planar shape and being parallel to each of two sides of the first two-dimensional grating.

17. The laser according to claim 1, wherein the two-dimensional grating of the first pits is a regular triangular grating.

* * * * *